(12) United States Patent
Boulestin

(10) Patent No.: US 12,130,651 B2
(45) Date of Patent: Oct. 29, 2024

(54) CURRENT MIRROR

(71) Applicant: STMicroelectronics (Grenoble 2) SAS, Grenoble (FR)

(72) Inventor: Renald Boulestin, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 163 days.

(21) Appl. No.: 17/822,266

(22) Filed: Aug. 25, 2022

(65) Prior Publication Data

US 2023/0054214 A1 Feb. 23, 2023

(30) Foreign Application Priority Data

Aug. 26, 2021 (FR) ...................... 2108926

(51) Int. Cl.
| | |
|---|---|
| *H03M 1/66* | (2006.01) |
| *G05F 3/26* | (2006.01) |
| *H01L 27/088* | (2006.01) |
| *H01L 29/423* | (2006.01) |

(52) U.S. Cl.
CPC ............ *G05F 3/262* (2013.01); *H01L 27/088* (2013.01); *H01L 29/42376* (2013.01); *H03M 1/66* (2013.01)

(58) Field of Classification Search
CPC .......... G05F 3/62; H03M 1/66; H01L 27/008; H01L 29/42376
USPC ....................................................... 341/144
See application file for complete search history.

(56) References Cited

U.S. PATENT DOCUMENTS

| | | | |
|---|---|---|---|
| 4,064,506 | A | 12/1977 | Cartwright, Jr. |
| 5,982,206 | A | 11/1999 | Tachio et al. |
| 2008/0061630 | A1 | 3/2008 | Andreu et al. |
| 2011/0084682 | A1 | 4/2011 | Yu et al. |
| 2012/0176198 | A1* | 7/2012 | Tanaka ................. H03F 3/345 330/288 |
| 2014/0320204 | A1* | 10/2014 | Kohsiek ............... H03H 11/245 327/581 |
| 2020/0366057 | A1* | 11/2020 | Sumino ................. H01S 5/062 |

FOREIGN PATENT DOCUMENTS

EP        1789131 B1     10/2016

* cited by examiner

*Primary Examiner* — Peguy Jean Pierre
(74) *Attorney, Agent, or Firm* — Slater Matsil, LLP

(57) ABSTRACT

A current mirror circuit includes a first MOS-type transistor and a second MOS-type transistor assembled as a current mirror, wherein the first transistor has a first gate length different from a second gate length of the second transistor.

20 Claims, 8 Drawing Sheets

CURRENT MIRROR

CROSS-REFERENCE TO RELATED APPLICATIONS

This application claims the priority benefit of French patent application number FR2108926, filed on Aug. 26, 2021, entitled "Miroir de courant," which is hereby incorporated herein by reference to the maximum extent allowable by law.

TECHNICAL FIELD

The present disclosure generally concerns electronic circuits and systems. More particularly, the present disclosure relates to electronic circuits enabling copying of a current, and more precisely to current mirror circuits.

BACKGROUND

There exists a multitude of electronic circuits adapted to performing elementary operations used in more complex electronic devices. Among the most current elementary operations to be performed, the copying of a current is very useful.

A current mirror circuit, or current mirror, is an electronic circuit enabling copying of a current flowing through a first conductor into a second conductor.

There is a need for a higher-performance current mirror circuit.

SUMMARY

There is a need for a higher-performance current mirror circuit.

There is a need for a current mirror circuit enabling multiplying of a current by a rational number.

An embodiment overcomes all or part of the disadvantages of known current mirror circuits.

An embodiment provides a current mirror circuit comprising a first MOS-type transistor and a second MOS-type transistor assembled as a current mirror, wherein the first transistor has a first gate length different from a second gate length of the second transistor.

According to an embodiment, the first gate length is the product of a first coefficient and of a reference gate length, the second gate length is the product of a second coefficient and of the reference gate length, the first and second coefficients being rational numbers.

According to an embodiment, the first transistor is formed by a series of a first number of third series-coupled MOS-type transistors and the sum of the gate lengths of the third transistors is equal to the first gate length, wherein the second transistor is formed by a series of a second number of fourth series-coupled MOS-type transistors, the sum of the gate lengths of the fourth transistors is equal to the second gate length.

According to an embodiment, the third transistors all have the same gate length, and the fourth transistors all have the same gate length.

According to an embodiment, the third transistors and the fourth transistors all have the same gate length, and the first number is different from the second number.

According to an embodiment, the first number is greater than or equal to twenty, and the second number is greater than or equal to twenty.

According to an embodiment, the gates of the third transistors and the gates of the fourth transistors are all coupled to a node of interconnection of the gates of the first and second transistor.

According to an embodiment, among the third transistors, at least one is selectable and de-selectable.

According an embodiment, among the fourth transistors, at least one is selectable and de-selectable.

According to an embodiment, the fourth selectable and de-selectable transistor is associated with a switch and with a fifth transistor.

According to an embodiment, the switch is arranged between the gate of the associated fourth selectable and de-selectable transistor and the interconnection node, and/or the fifth transistor is arranged in parallel with the fourth associated selectable and de-selectable transistor.

According to an embodiment, the selectable and de-selectable fourth transistor is associated with a selector.

According to an embodiment, the selector is arranged between the gate of the associated fourth selectable and de-selectable transistor and the interconnection node.

According to an embodiment, the first transistor has a first gate width different from a second gate width of the second transistor.

Another embodiment provides an integrated circuit comprising a previously-described circuit.

Another embodiment provides a digital-to-analog converter comprising a previously-described circuit.

BRIEF DESCRIPTION OF THE DRAWINGS

The foregoing and other features and advantages of the present invention will be discussed in detail in the following non-limiting description of specific embodiments in connection with the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, it is said that two transistors T1 and T2 of same nature are series-coupled between a node S1 and a node S2 if the gates of the two transistors T1 and T2 are coupled, preferably connected or interconnected, to each other, a conduction terminal of a first type of transistor T1 is coupled, preferably connected, to node S1, a conduction terminal of a second type of transistor T1 is coupled, preferably connected, to the conduction terminal of the first type of transistor T2, and a conduction terminal of the second type of transistor T2 is coupled, preferably connected, to node T2.

Similarly, it is said that the two transistors T1 and T2 of same nature are coupled in parallel between node S1 and node S2 if the gates of the two transistors T1 and T2 are coupled, preferably connected or interconnected, to each other, the conduction terminals of the first type of the two transistors T1 and T2 are coupled, preferably connected, to each other and to node S1, and the conduction terminals of the second type of the two transistors T1 and T2 are coupled, preferably connected, to each other and to node S2.

Figure 1:
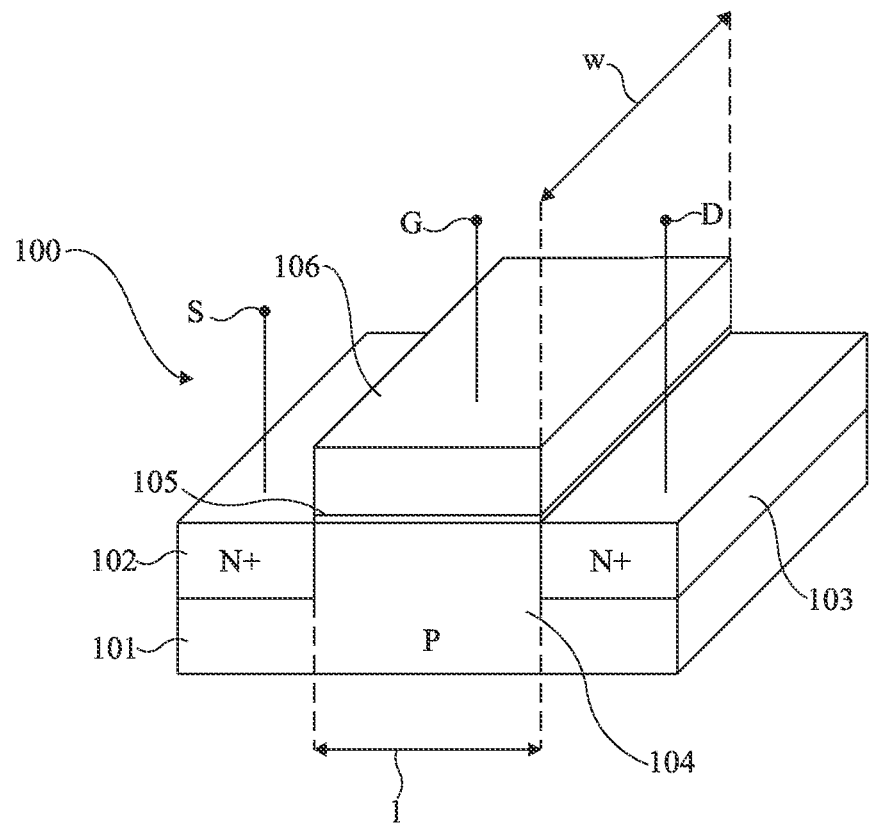
FIG. 1 schematically shows a perspective view of a MOS-type transistor.

FIG. 1 is a perspective view of a transistor 100.

Transistor 100 is an insulated field-effect transistor, or metal oxide semiconductor field-effect transistor, also called MOSFET-type transistor, or also MOS-type transistor. Further, transistor 100 is, in FIG. 1, an N-channel MOS transistor, or N-type MOS transistor, or also NMOS transistor.

Transistor 100 is formed from a semiconductor substrate 101, for example, made of silicon. Substrate 101 is for example P-type doped (P). A well 102 is formed from a surface, the upper surface in FIG. 2, of substrate 101, more particularly on the left-hand side of the substrate in FIG. 1. Well 102 is N-type doped (N+) and forms the drain of transistor 100. One or a plurality of contacts may be formed on the surface of well 102 to couple well 102 to a source node S. A well 103 is further formed from the upper surface of substrate 101 and more particularly on the right-hand side of substrate 101 in FIG. 1. Well 103 is N-type doped (N+) and forms the drain of transistor 100. One or a plurality of contacts may be formed on the surface of well 103 to couple well 103 to a drain node D. Wells 102 and 103 are not in contact, and are separated by a portion 104 of substrate 101 called channel region. A gate stack, formed of a gate insulator layer 105 and of a gate layer 106, is formed on portion 104 of substrate 101. Gate insulator layer 105 rests on top of and in contact with the surface of portion 104 of substrate 101. Gate layer 106 rests on top of and in contact with the surface of gate insulator layer 105. Gate layer 106 forms the gate of transistor 100. One or a plurality of contacts may be formed on the surface of gate layer 106 to couple layer 106 to a gate node G.

According to an alternative embodiment, the doping types of the elements forming transistor 100 may all be inverted. Transistor 100 is, in this case, a P-channel MOS transistor, or P-type MOS transistor, also called PMOS transistor.

Transistor 100 is characterized by two measurements: its gate width w and its gate length l. Gate length l corresponds to the distance between the two wells 102 and 103, that is, in the orientation of FIG. 1, to the width of the portion 104 of substrate 101. Gate width w corresponds to the depth of transistor 100 in the orientation of FIG. 1. The two measurements w and l are shown in FIG. 1.

Figure 2:
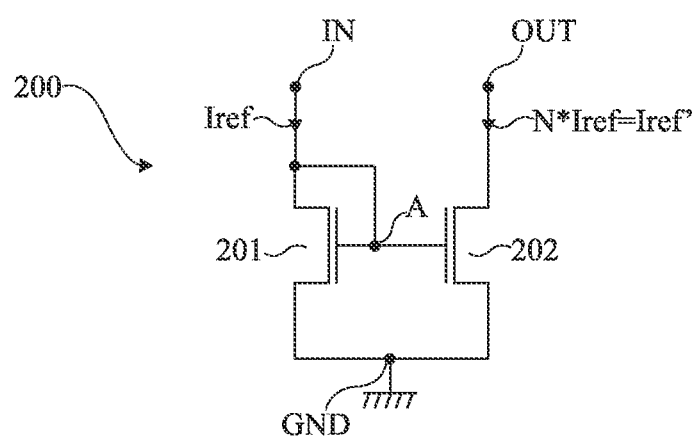
FIG. 2 shows an electric diagram of an embodiment of an electronic circuit.

FIG. 2 is an electric diagram of an embodiment of a current mirror circuit 200, also called current mirror 200.

Current mirror 200 comprises two transistors 201 and 202. Transistors 201 and 202 are MOS transistors and more precisely transistors of the same type. In FIG. 1, and according to an example, transistors 201 and 202 are NMOS-type transistors. According to a variant, transistors 201 and 202 may be PMOS-type transistors, it will be within the abilities of those skilled in the art to adapt the connections of the current mirror in this case.

Transistors 201 and 202 are assembled as a current mirror. In other words, transistors 201 and 202 have their gates coupled, preferably connected or interconnected, to an interconnection node A. Further, transistor 201 has its gate coupled, preferably connected or interconnected, to one of its conduction terminals. It is then said that transistor 201 is diode-assembled. More particularly, when transistor 201 is an NMOS-type transistor, transistor 201 has its gate coupled, preferably connected or interconnected, to its drain.

Transistor 201 further has one of its conduction terminals interconnected to the same conduction terminal of transistor 202. More particularly, when transistors 201 and 202 are NMOS-type transistors, the sources of transistors 201 and 202 are interconnected. The interconnection node of the conduction terminals of transistors 201 and 202 is noted GND. According to an example, interconnection node GND receives a reference potential, for example, the ground.

According to an embodiment, transistors 201 and 202 have different gate lengths. More particularly, transistors 201 and 202 are of the same type as the transistor 100 described in relation with FIG. 1, in the same way as the gate length l of transistor 100 is defined, one defines as L1 the gate length of transistor 201 and as L2 the gate length of transistor 202. Gate lengths L1 and L2 are defined with respect to a reference gate length L, or reference length L. Gate length L1 is the result of the product of reference L by a coefficient N1, N1 preferably being an integer. Gate length L2 is the result of the product of reference length L by a coefficient N2, N2 preferably being an integer. Coefficients N1 and N2 are different, but may be equal. Transistors 201 and 202 however have substantially identical or even identical gate widths W.

Figure 8:
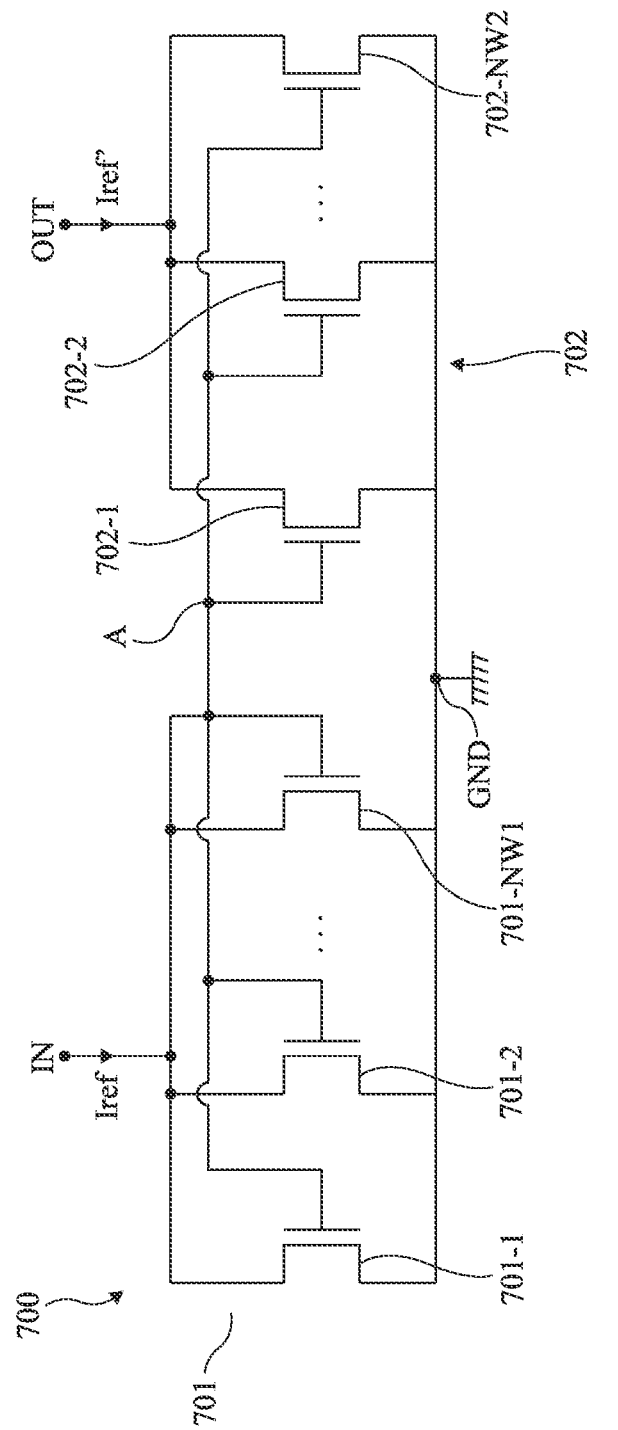
FIG. 8 shows another electric diagram of an embodiment of an electronic circuit.

According to an alternative embodiment, transistors 201 and 202 may have different gate widths, this variant is described in further detail in relation with FIG. 8.

Transistor 201 receives on its conduction terminal coupled to its gate, that is, its drain, a current Iref to be copied, or input current Iref. Current Iref is for example delivered to a node IN by a current source, not shown in FIG. 2, but in practice the drain of transistor 201 may receive current Iref from any node of an electronic device. By convention, current Iref flows from node IN to the drain of transistor 201.

Transistor 202 delivers a copied current Iref', or output current Iref', on its free conduction terminal, that is, its drain in FIG. 2. Current Iref' flows from an output node OUT to the drain of transistor 202. Current Iref' is proportional to current I, with a proportionality coefficient N defined by the physical size ratio between transistors 201 and 202. More particularly, coefficient N may be expressed as being the ratio of coefficient N1 by coefficient N2 defined hereabove. Thus, the copied current Iref' is provided by the following mathematical formula:

$$Iref' = N * Iref = \frac{N1}{N2} Iref \qquad \text{[Math 1]}$$

Indeed, diode-assembled transistor 201 operates in saturation, and its current Iref is given by the following mathematical formula:

$$Iref = \frac{\mu_n * C_{ox}}{2} * \frac{W}{L1}(VGS1 - VT1)^2 \qquad \text{[Math 2]}$$

wherein:
μn represents the mobility of the charge carriers, here the mobility of electrons since the transistor is an NMOS transistor;
Cox represents the capacitance of the insulating layer of the gate stack of transistor 201;
W represents the gate width of transistor 201;
L1 represents the gate length of transistor 201;
VGS1 represents the voltage between the gate and the source of transistor 201; and
VT1 represents the threshold voltage of transistor 201.

The current Iref' of transistor 202 is given by the following similar mathematical formula:

$$Iref' = \frac{\mu'_n * C'_{ox}}{2} * \frac{W}{L2}(VGS2 - VT2)^2 \qquad \text{[Math 3]}$$

wherein:
μ'n represents the mobility of the charge carriers, here the mobility of electrons since the transistor is an NMOS transistor;
C'ox represents the capacitance of the insulating layer of the gate stack of transistor 202;
W represents the gate width of transistor 202;
L2 represents the gate length of transistor 202;
VGS2 represents the voltage between the gate and the source of transistor 202; and
VT2 represents the threshold voltage of transistor 202.

However, transistors 201 and 202 have the same charge carrier mobility, whereby $\mu_n$ is equal to $\mu'_n$, the same insulating layer capacitance, whereby $C_{ox}$ is equal to $C'_{ox}$, the same gate width W, the same voltage between their gate and their source, whereby VGS1 is equal to VGS2, and the same threshold voltage, whereby VT1 is equal to VT2.

Using these two mathematical formulas effectively provides the fact that output current Iref' is given by formula Math 1 disclosed hereabove.

Figure 3:
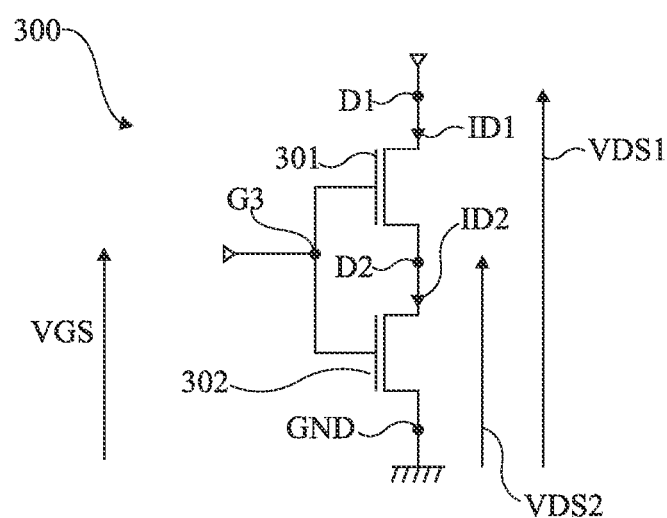
FIG. 3 shows an electric diagram of a transistor arrangement.

FIG. 3 is an electric diagram of a series arrangement 300 of transistors 301 and 302.

Transistors 301 and 302 are NMOS-type transistors. Transistors 301 and 302 have different gate lengths, noted L1 and L2, but have, besides, similar technical characteristics, in particular, the same charge carrier mobility noted $\mu_n$, the same insulating layer capacitance noted $C_{ox}$, the same gate width noted W, and the same threshold voltage noted VT.

Transistor 301 and 302 are arranged in series with each other between a node D1 and a node GND receiving a reference potential, for example, the ground. The drain of transistor 301 is coupled, preferably connected, to node D1, and the source of transistor 301 is coupled, preferably connected, to a node D2. The drain of transistor 302 is coupled, preferably connected, to node D2, that is, to the source of transistor 301, and the source of transistor 302 is coupled, preferably connected, to a node GND. The gates of transistors 301 and 302 are coupled, preferably connected or even interconnected, together and to a node G. In the following description, when series-arranged transistors are described, this designates transistors having an arrangement similar to the arrangement 300 of transistors 301 and 302.

The voltage between node D1 and node GND is noted voltage VDS1. The current flowing through transistor 301 is noted current ID1. The voltage between node D2 and node GND is noted voltage VDS2. The current flowing through transistor 302 is noted current ID2. The voltage between node G3 and node GND is noted voltage VGS.

The inventor has shown that, for applications of the embodiments described hereafter, the series arrangement of the two transistors 301 and 302 of different gate lengths L1 and L2 is equivalent to a transistor having a length equal to the sum of the gate lengths of the two first transistors. More particularly, this transistor is characterized, in particular, by the same charge carrier mobility noted μn, the same insulating layer capacitance, noted Cox, the same gate width noted W, the same threshold voltage noted VT. The inventor has more particularly shown that this equivalence applies when transistors 301 and 302 both operate in linear mode, and this equivalence applies when transistor 301 operates in saturation mode and when transistor 302 operates in linear mode, or conversely.

To avoid overloading the present description, these three demonstrations are not integrally re-transcribed herein.

When transistors 301 and 302 operate in linear mode, currents ID1 and ID2 are given by the following mathematical formulas:

$$\begin{cases} ID1 = \frac{\mu_n * C_{ox}}{2} * \frac{W}{L1}[2(VGS - VDS2 - VT)(VDS1 - VDS2) - \\ \qquad (VDS1 - VDS2)^2] \\ ID2 = \frac{\mu_n * C_{ox}}{2} * \frac{W}{L2}[2(VGS - VT)VDS2 - VDS2^2] \end{cases} \qquad \text{[Math 4]}$$

The equivalent transistor is series-coupled between nodes D1 and GND, its drain being on the side of node D1 and its source being on the side of node GND, and its gate is coupled, preferably connected, to node G. The current ID3 flowing through the equivalent transistor is the following:

$$ID3 = \frac{\mu_n * C_{ox}}{2} * \frac{W}{L1 + L2}[2(VGS - VT)VDS1 - VDS1^2] \qquad \text{[Math 5]}$$

Since transistors 301 and 302 receive the same voltage on their gates and have the same threshold voltage VT, currents ID1 and ID2 are equal. By developing and reducing the expressions of currents ID1 and ID2, there results the following mathematical relation:

$$\frac{1}{L1 + L2}(2(VGS - VT)VDS1 - VDS1^2) = \qquad \text{[Math 6]}$$

$$\frac{1}{L2}(2(VGS-VT)VDS2-VDS2^2)$$

According to relation Math 6, it can be deduced that the current ID3 flowing through the equivalent transistor of gate length L1+L2 is the same as the current ID2 flowing through transistor 302 in linear mode, and thus the same as the current ID1 flowing through transistor 301 in linear mode. It can thus be considered that the series arrangement of transistors 301 and 302 in linear mode is equivalent to a transistor having as a gate length the sum of the gate lengths L1 and L2 of transistors 301 and 302.

When transistor 301 operates in saturation mode and when transistor 302 operates in linear mode, currents ID1 and ID2 are given by the following mathematical formulas:

$$\begin{cases} ID1 = \frac{\mu_n * C_{ox}}{2} * \frac{W}{L1}[2(VGS-VDS2-VT)(VDS1-VDS2) - (VDS1-VDS2)^2] \\ ID2 = \frac{\mu_n * C_{ox}}{2} * \frac{W}{L2}(VGS-VT)^2 \end{cases} \quad \text{[Math 7]}$$

Eventually, and by a line of reasoning similar to that previously developed, the inventor has shown that the equivalent transistor then operates in saturation mode, and the current ID3 flowing therethrough is the following:

$$ID3 = \frac{\mu_n * C_{ox}}{2} * \frac{W}{L1+L2}(VGS-VT)^2 \quad \text{[Math 8]}$$

By extension, this principle may be generalized to the serializing of any number of transistors between two nodes, the equivalent transistor would thus be a transistor having a gate length equal to the sum of the lengths of all the serialized transistors.

A series arrangement of transistors such as that described herein may be used to implement the embodiment described in relation with FIG. 2. This is described in relation with FIG. 4.

Figure 4:
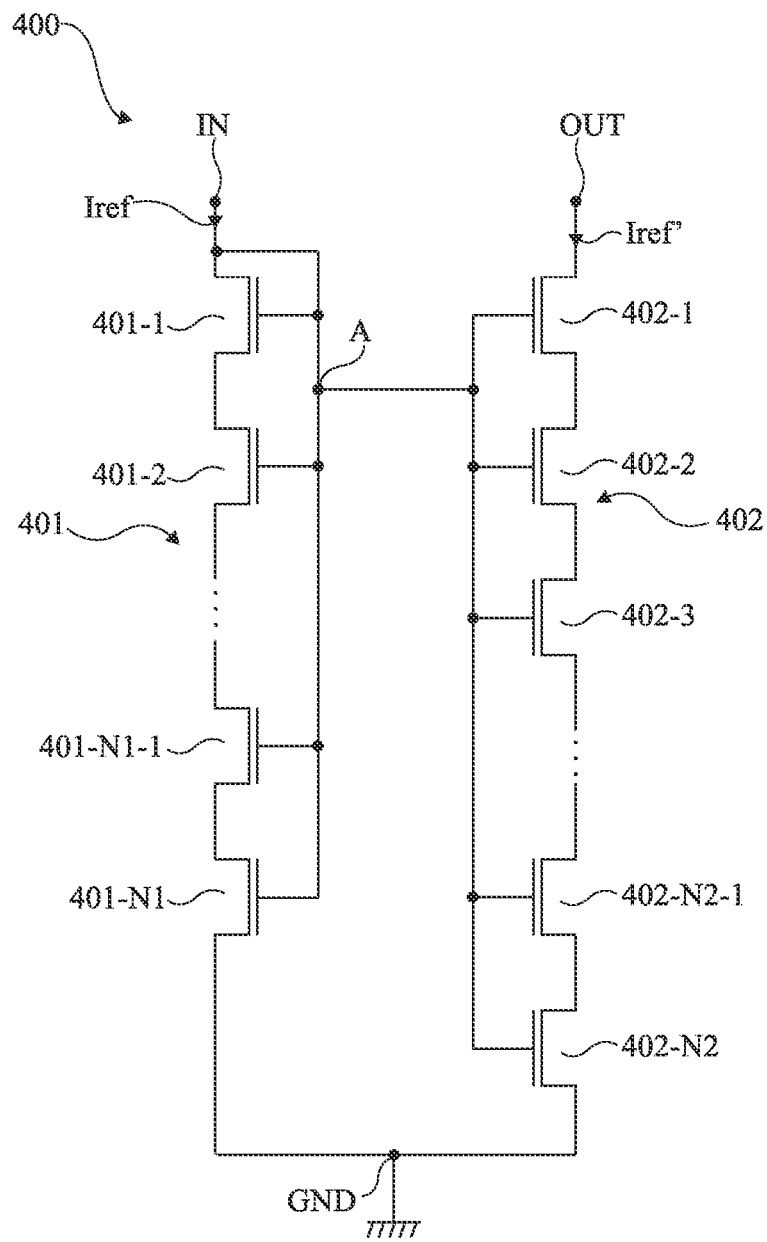
FIG. 4 shows another electric diagram of an embodiment of an electronic circuit.

FIG. 4 is an electric diagram of an embodiment of a current mirror circuit 400, also called current mirror 400.

Current mirror 400 is equivalent to the current mirror 200 described in relation with FIG. 2. Current mirror 400 is formed of two branches 401 and 402 respectively equivalent to transistor 201 and to transistor 202. In the embodiment disclosed herein, coefficients N1 and N2 are integers.

Current mirror 400 thus has elements common with the current mirror 200 described in relation with FIG. 3, which are not described again herein in detail. Only their differences are highlighted.

As described in relation with FIG. 3, transistors 201 and 202 may each be implemented by series-arranged transistors having the sum of their gate lengths equal to the gate length of transistor 201 or 202. Thus, each branch 401 and 402 comprises a multitude of series-arranged transistors, as described hereafter.

Branch 401 is the input branch of current mirror 400. Branch 401 is arranged between input node IN and node GND. Branch 401 comprises N1 NMOS-type transistors 401-1, 401-2, . . . , 401-N1-1, and 401-N1 having, as a gate length, reference gate length L. Thus, the sum of the gate lengths of transistors 401-1 to 401-N1 is equal to L1, that is, the product of reference gate length L and of coefficient N1.

The N1 transistors 401-1, 401-2, . . . , 401-N1-1, and 401-N1 are coupled, preferably connected, in series with one another, and between nodes IN and GND. Thus, transistor 401-1 has its drain coupled, preferably connected, to node IN. Transistor 401-N1 has its source coupled, preferably connected, to node GND. Each transistor 401-$i$, i being an integer varying from 2 to N1-1, has its drain coupled, preferably connected, to the source of the previous transistor 401-$i$-1, and has its source coupled, preferably connected, to the drain of the next transistor 401-$i$+1. Further, all transistors 401-1 to 401-N1 have their gates coupled to interconnection node A and to the source of transistor 401-1. Transistor 401-1 is thus diode-assembled.

Branch 402 is the output branch of current mirror 400. Branch 402 is arranged between output node OUT and node GND. Branch 402 comprises N2 NMOS-type transistors 402-1, 402-2, 402-3, . . . , 402-N2-1, and 402-N2 having a gate length which is reference gate length L. Thus, the sum of the gate lengths of transistors 402-1 to 402-N2 is effectively equal to the gate length L2 of transistor 302, that is, to the product of reference gate length L by coefficient N2. The N2 transistors 402-1 to 402-N2 are coupled, preferably connected, in series with one another, and between nodes OUT and GND. Thus, transistor 402-1 has its drain coupled, preferably connected, to node OUT. Transistor 402-N2 has its source coupled, preferably connected, to node GND. Each transistor 402-$i$, i being an integer varying between 2 and N2-1, has its drain coupled, preferably connected, to the source of the previous transistor 402-$i$-1, and has its source coupled, preferably connected, to the drain of the next transistor 402-$i$+1. Further, all transistors 402-1 to 402-N2 have their gates coupled to interconnection node A.

Further, transistors 401-1 to 401-N1 and 402-1 to 402-N2 have the same technical characteristics as transistors 201 and 202, that is, the same charge carrier mobility noted $\mu_n$, the same insulating layer capacitance noted $C_{ox}$, the same gate width node W, and the same threshold voltage noted VT.

Input node IN delivers current Iref to branch 401, and branch 402 delivers copied current Iref' to output node OUT. Current mirror 400 being equivalent to current mirror 200, the copied current Iref' is always given by the following mathematical formula:

$$Iref' = N * Iref = \frac{N1}{N2} Iref \quad \text{[Math 9]}$$

According to an embodiment, to implement current mirror 400, coefficients N1 and N2 are generally greater than or equal to twenty (20), for example, in the order of fifty (50), one hundred (100), or one hundred and fifty (150).

An advantage of current mirror 400 is that it easily enables adjusting multiplication coefficient N to enable obtaining the copied current Iref', it is sufficient for this purpose to adjust the number of transistors of branches 401 and 402 to obtain the adequate ratio. Further, this embodiment enables more easily forming a non-integer coefficient N, more precisely a rational coefficient N.

The embodiment described in relation with FIG. 4 is a preferred embodiment where all transistors have a same gate length. According to a more complex alternative embodiment, the transistors may have different gate lengths.

Figure 5:
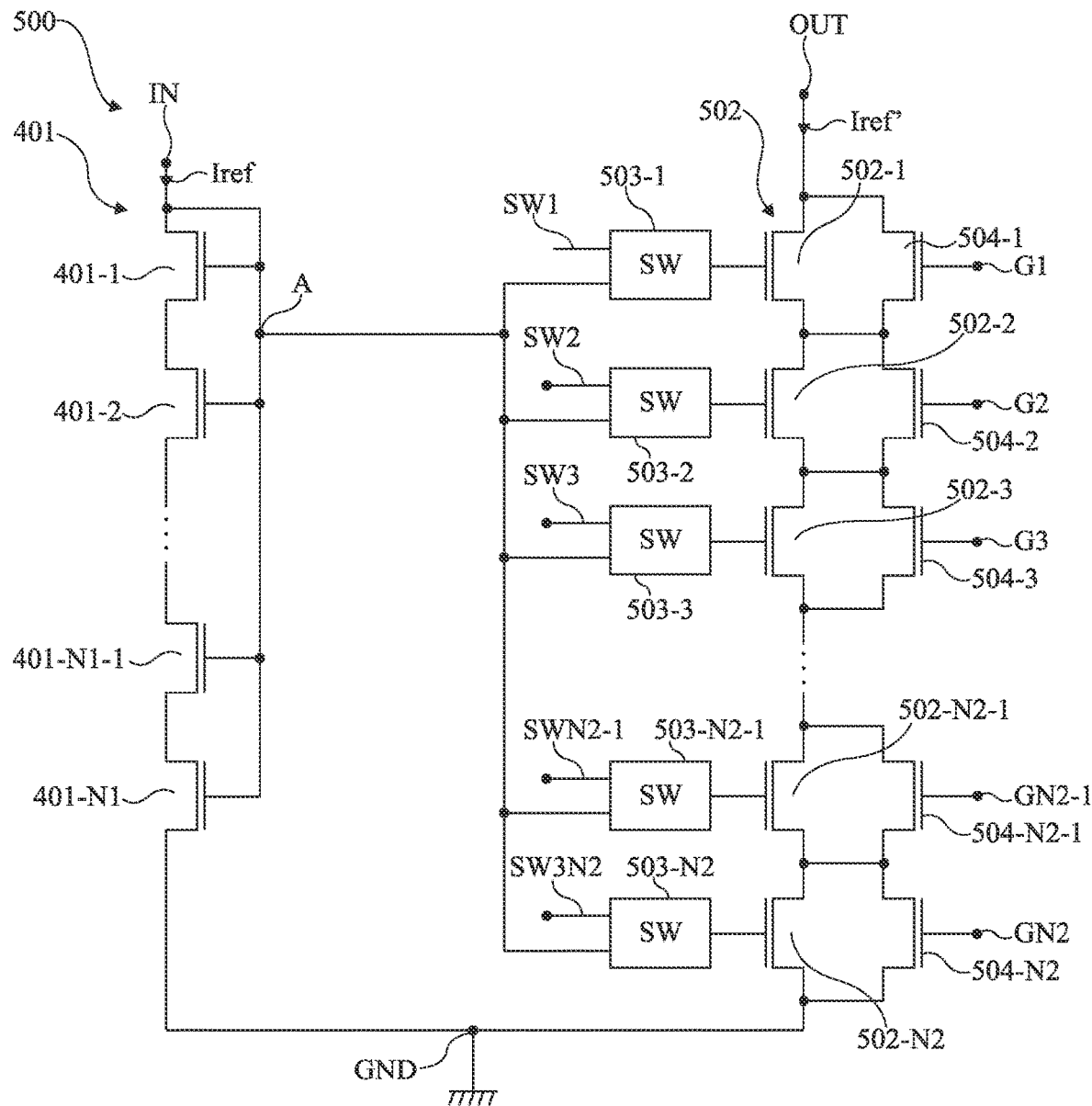
FIG. 5 shows another electric diagram of an embodiment of an electronic circuit.
Figure 6:
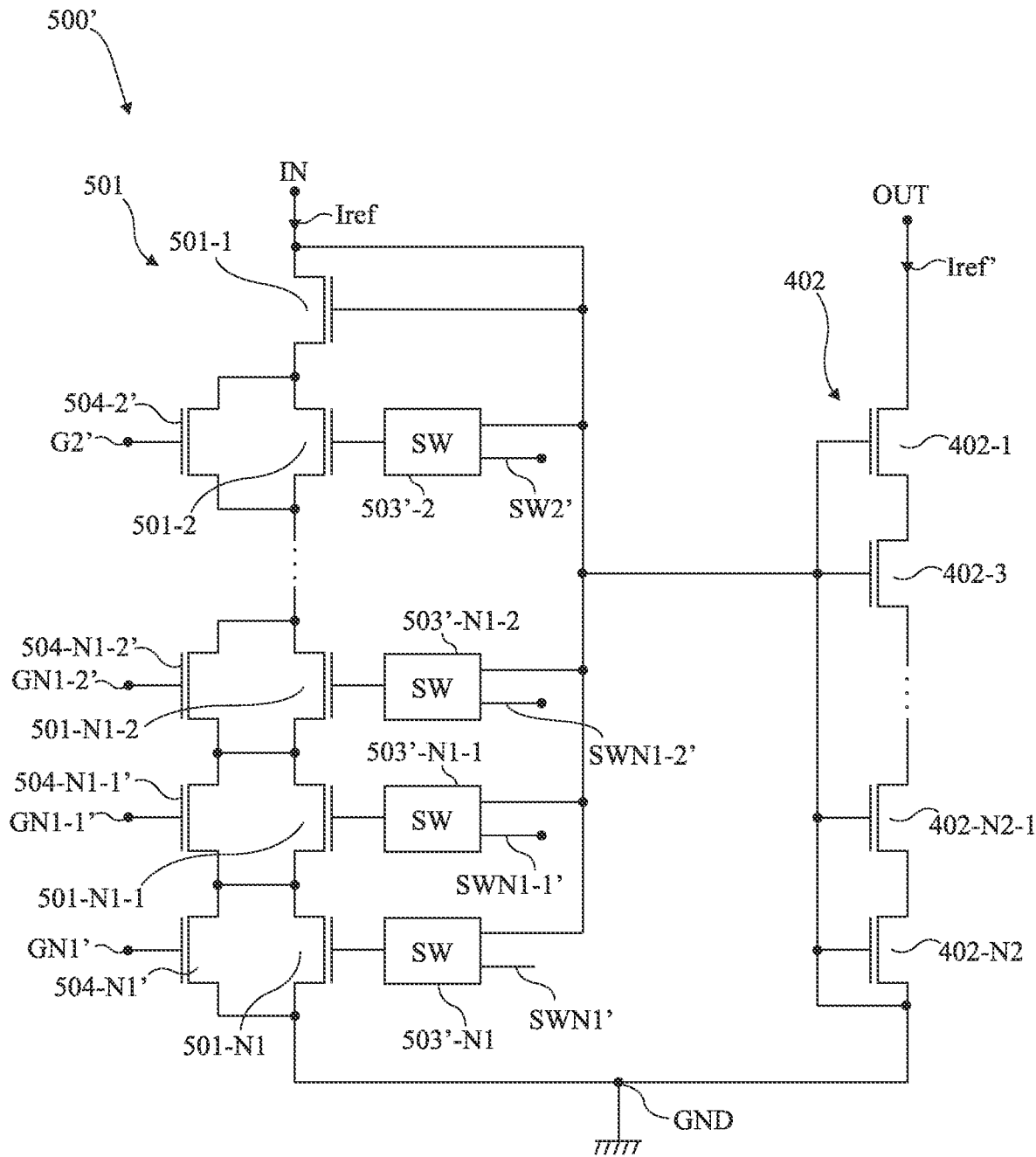
FIG. 6 shows another electric diagram of an embodiment of an electronic circuit.
Figure 7:
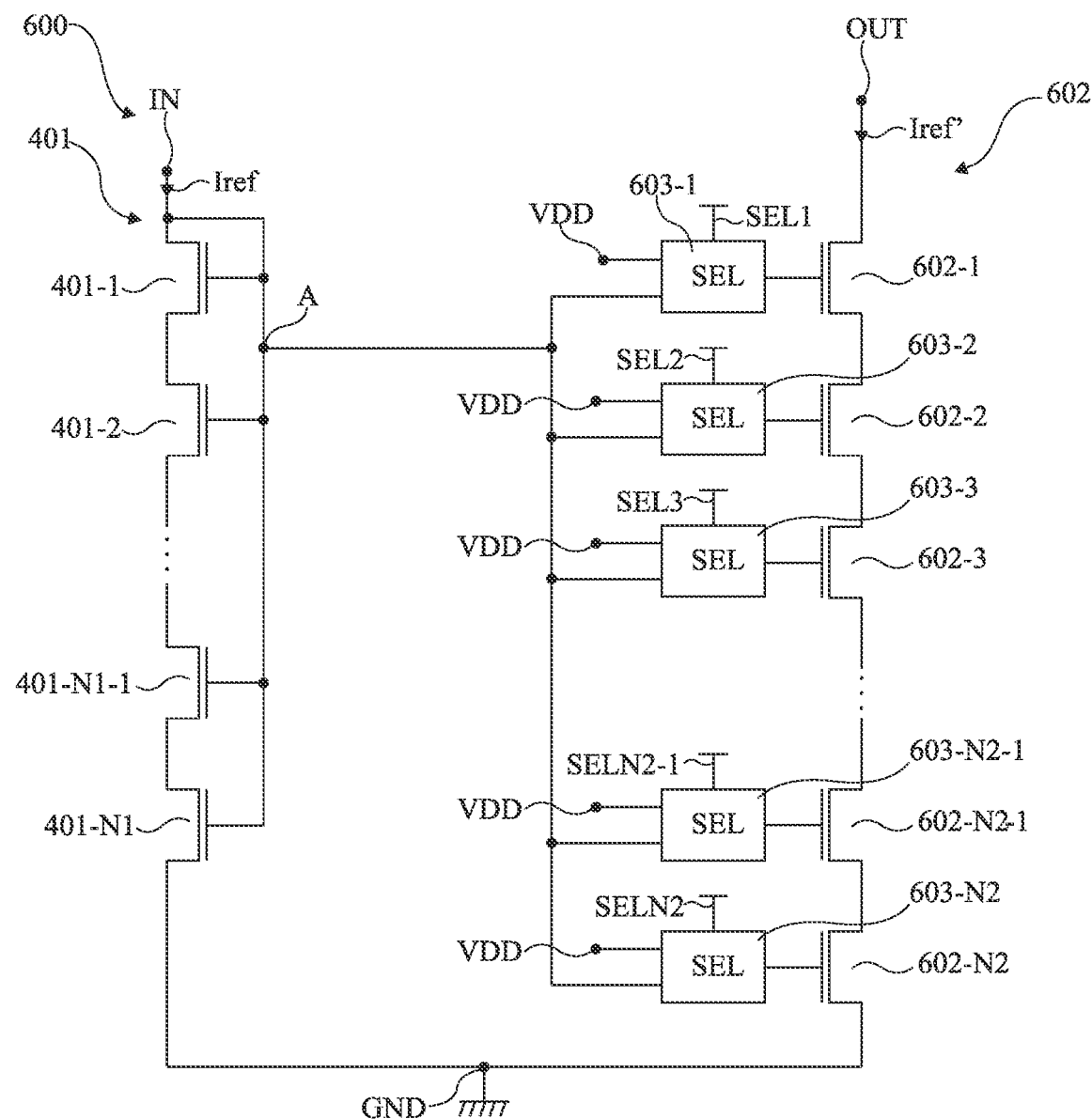
FIG. 7 shows another electric diagram of an embodiment of an electronic circuit.

FIGS. 5 to 7 show embodiments of a current mirror similar to the current mirror 400 described in relation with FIG. 4 but where coefficient N is electronically adjustable.

FIG. 5 is an electric diagram of an embodiment of a current mirror circuit 500, also called current mirror 500.

Current mirror 500 comprises elements common with the current mirror 400 described in relation with FIG. 2. These elements are not described again in detail and only the differences between currents mirrors 400 and 500 are highlighted.

Current mirror 500 comprises as an input branch the input branch 401 comprising, as a reminder, N1 transistors 401-1 to 401-N1 having a gate length L, series-assembled between nodes IN and GND.

The current mirror comprises, as an output branch, an output branch 502 arranged between output node OUT and node GND. Branch 502 comprises N2 NMOS-type transistors 502-1, 502-2, 502-3, . . . , 502-N2-1, and 502-N2 having, as a gate length, reference gate length L. The N2 transistors 502-1 to 502-N2 are coupled, preferably connected, in series with one another and between nodes OUT and GND. Thus transistor 502-1 has its drain coupled, preferably connected, to node OUT. Transistor 502-N2 has its source coupled, preferably connected, to node GND. Each transistor 502-$i$, i being an integer varying between 2 and N2-1, has its drain coupled, preferably connected, to the source of the previous transistor 502-$i$–1, and has its source coupled, preferably connected, to the drain of the next transistor 502-$i$+1. Further, all transistors 502-1 to 502-N2 have their gates coupled to interconnection node A.

According to an embodiment, each transistor 502-$j$, j being an integer varying from 1 to N2, is associated with a switch 503-$j$ (SW) and with a short-circuit transistor 504-$j$ enabling to select and to de-select transistor 502-$j$. Switch 503-$j$ is arranged between the gate of transistor 502-$j$ and interconnection node A. Switch 503-$j$ is controlled by a signal. The switch is, in practice, for example implemented by a transistor. Transistor 504-$j$ is arranged in parallel with transistor 502-$j$. More particularly, the source of transistor 504-$j$ is coupled, preferably connected, to the source of transistor 502-$j$, and the drain of transistor 504-$j$ is coupled, preferably connected, to the drain of transistor 502-$j$. The gate of transistor 504-$j$ receives a signal Gj. When transistor 502-$j$ is selected, signal SWj controls the switch so that it is conductive, and signal Gj controls the transistor so that it is non-conductive. Conversely, when transistor 502-$j$ is not selected or is de-selected, signal SWj controls the switch so that it is non-conductive, and signal Gj controls the transistor so that it is conductive.

By selecting or de-selecting transistors 502-1 to 501-N2, it is possible to adjust coefficient N by modifying the value of coefficient N2.

Further, according to an alternative embodiment, not shown, to save space, it is within the abilities of those skilled in the art to make groups of transistors 502-1 to 502-N2 selectable and de-selectable together. More precisely, instead of making each transistor 502-$j$ individually selectable or de-selectable, it may form part of a group of K, K being an integer smaller than N2, transistors 502-1 and 502-N2 selectable or de-selectable by group, for example, by having a single switch and a single short-circuit transistor common to these K transistors.

Further, according to an alternative embodiment, similarly, it is within the abilities of those skilled in the art to make coefficient N1 modifiable, by making the transistors 401-2 to 401-N1 of input branch 401 selectable and de-selectable. Similarly, those skilled in the art may envisage a version of current mirror 500 where only coefficient N1 is modifiable, an example of this embodiment is illustrated in FIG. 6.

FIG. 6 is an electric diagram of an embodiment of a current mirror circuit 500', also called current mirror 500'.

Current mirror 500' is similar to the current mirror 500 described in relation with FIG. 5. Conversely to circuit 500, circuit 500' has its coefficient N1 electronically modifiable in the same way as coefficient N2 is modifiable in circuit 500. Thus, each transistor 501-2, . . . , 501-N1 is associated with, respectively, a switch 503'-2, . . . , 503'-N1 and with, respectively, a transistor 504'-2, . . . , 504'-N1. Switches 503'-2, . . . , 503'-N1 are similar to switches 503-2, . . . , 503-N1. Transistors 504'-2, . . . , 504'-N1 are similar to transistors 504-2, . . . , 504-N1.

Current mirror comprises as an output branch the branch 402 described in relation with FIG. 4.

FIG. 7 is an electric diagram of an embodiment of a current mirror circuit 600, also called current mirror 600.

Current mirror 600 comprises elements common with the current mirror 400 described in relation with FIG. 2. These elements are not described again in detail and only the differences between currents mirrors 400 and 600 are highlighted.

Current mirror 600 comprises as an input branch the input branch 401 comprising, as a reminder, N1 transistors 401-1 to 401-N1 having a gate length L, series-assembled between nodes IN and GND.

The current mirror comprises, as an output branch, an output branch 602 arranged between output node OUT and node GND. Branch 602 comprises N2 NMOS-type transistors 602-1, 602-2, 602-3, . . . , 602-N2-1, and 602-N2 having, as a gate length, reference gate length L. The N2 transistors 602-1 to 602-N2 are coupled, preferably connected, in series with one another and between nodes OUT and GND. Thus transistor 602-1 has its drain coupled, preferably connected, to node OUT. Transistor 602-N2 has its source coupled, preferably connected, to node GND. Each transistor 602-$i$, i being an integer varying between 2 and N2-1, has its drain coupled, preferably connected, to the source of the previous transistor 602-$i$–1, and has its source coupled, preferably connected, to the drain of the next transistor 6024+1. Further, all transistors 602-1 to 602-N2 have their gates coupled to interconnection node A.

According to an embodiment, each transistor 602-$j$, j being an integer varying between 1 and N2, is associated with a selector 603-$j$ (SEL) enabling to select and to de-select transistor 602-$j$. Selector 603-$j$ is arranged between the gate of transistor 602-$j$ and interconnection node A. Selector 603-$j$ is more particularly adapted to coupling the gate of transistor 602-$j$ either to node A, or to a node VDD receiving a reference potential different from ground. Selector 603-$j$ is controlled by a signal SELj. The selector is, in practice, for example, implemented by a transistor arrangement. To select transistor 602-$j$, signal SELj indicates to selector 603-$j$ to couple the gate of transistor 602-$j$ to node A. To de-select transistor 602-$j$, signal SELj indicates to selector 603-$j$ to couple the gate of transistor 602-$j$ to node VDD.

As described for current mirror 500 in relation with FIG. 5, by selecting or de-selecting transistors 602-1 to 601-N2, it is possible to adjust coefficient N by modifying the value of coefficient N2.

Further, according to an alternative embodiment, not shown, to save space, it is within the abilities of those skilled in the art to make groups of transistors 602-1 to 602-N2 selectable and de-selectable together. More precisely, instead of making each transistor 602-$j$ individually selectable or de-selectable, it may form part of a group of K, K being an integer smaller than N2, transistors 602-1 and 602-N2 selectable or de-selectable by group, for example, by having a single switch and a single short-circuit transistor common to these K transistors.

Further, according to an alternative embodiment, similarly, it is within the abilities of those skilled in the art to make coefficient N1 modifiable, by making the transistors 401-2 to 401-N1 of input branch 401 selectable and de-selectable. Similarly, those skilled in the art may envisage a version of current mirror 600 where only coefficient N1 is modifiable.

FIG. 8 is an electric diagram of an embodiment of a current mirror circuit 700, also called current mirror 700.

As previously mentioned, current mirror 700 illustrates the case of a current mirror where the two equivalent transistors of the input branch and of the output branch having different gate lengths and gate widths.

Current mirror 700 comprises an input branch 701 and an output branch 702. Like for the current mirrors described in relation with FIGS. 2, 4 to 7, input branch 701 is arranged between input node IN and reference node GND, and receives an input current Iref on input node IN. Output branch 702 is arranged between output node OUT and reference node GND, and delivers output current Iref'.

Two transistors coupled in parallel between two nodes are equivalent to a single transistor coupled between these two same nodes having a gate length equal to the sum of the gate widths of the two transistors coupled in parallel.

Thus, to have equivalent transistors of different gate widths, each branch 701, 702 comprises a series of transistors, of different gate lengths but of equal gate widths, arranged in parallel with one another.

More particularly, input branch 701 is formed of NW1, NW1 being a natural integer, transistors 701-$i$, $i$ being a natural integer between 1 and NW1, coupled in parallel between nodes IN and GND. Transistors 701-$i$ all have the same gate width W, but have different gate lengths expressed according to reference gate length L. Thus, each transistor 701-$i$ has a gate length equal to the product of a coefficient Nin[$i$] and of reference gate length L, Nin[$i$] being an integer.

According to an example, transistors 701-$i$ are NMOS-type transistors. Each transistor 701-$i$ has its gate and its drain coupled, preferable connected, to node IN and to interconnection node A, and its source coupled, preferably connected, to node GND.

Input branch 702 is formed of NW2, NW2 being a natural integer, transistors 702-$i$, $i$ being a natural integer between 1 and NW2, coupled in parallel between nodes OUT and GND. Transistors 702-$i$ all have the same gate width W as the transistors 701-$i$ of input branch 701, but have different gate lengths expressed according to reference gate length L. Thus, each transistor 702-$i$ has a gate length equal to the product of a coefficient Nout[$i$] and of reference gate length L, Nout[$i$] being an integer.

According to an example, transistors 702-$i$ are NMOS-type transistors. Each transistor 702-$i$ has its gate and its drain coupled, preferably connected, to interconnection node A, and its source coupled, preferably connected, to node GND.

According to a variant, transistors 701-$i$ and 702-$i$ may be PMOS-type transistors, it will be within the abilities of those skilled in the art to adapt the connections of the transistors in this case.

In practice, each transistor 701-$i$, 702-$i$ may be formed by using Nin[$i$], Nout[$i$] transistors of gate lengths L and of gate widths W arranged in series with one another.

The output current Iref' supplied by the output node OUT of current mirror 700 is expressed as being the product of a coefficient M and of input current Iref. Coefficient M is a function of numbers NW1, Nin[1], ..., Nin[NW1], NW2, Nout[$i$], ..., and Nout[NW2].

Figure 9:
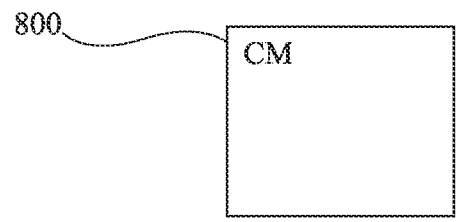
FIG. 9 schematically shows in the form of blocks an embodiment of an integrated circuit.

FIG. 9 schematically shows in the form of blocks an integrated circuit 800 (CM).

Integrated circuit 800 is adapted to comprise the different embodiments described in relation with FIGS. 2, and 4 to 8. Integrated circuit 800 may comprise a plurality of circuits including one of the current mirrors 200, 400, 500, or 600 of the previous drawings, or only comprise one of these current mirrors.

Figure 10:
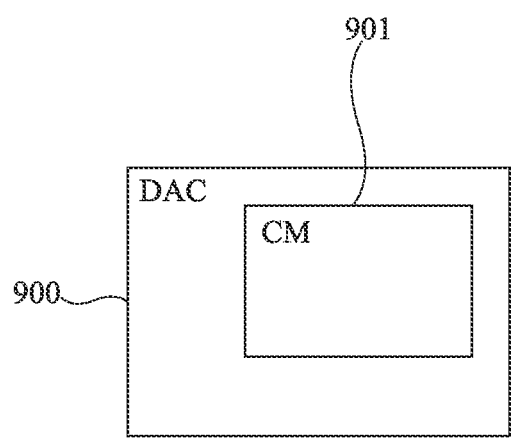
FIG. 10 schematically shows, in the form of blocks, an embodiment of an analog-to-digital converter.

FIG. 10 schematically shows in the form of blocks a digital-to-analog converter 900 (DAC).

Digital-to-analog converter 900 comprises different electronic circuits, including at least one mirror circuit 901 (CM) according to one of the embodiments previously disclosed in relation with FIGS. 2 and 4 to 6. According to an example of embodiment, the digital-to-analog converter may comprise an integrated circuit of the type of the integrated circuit described in relation with FIG. 9.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

What is claimed is:

1. A current mirror circuit comprising:
   a first metal oxide semiconductor (MOS)-type transistor and a second MOS-type transistor assembled as a current mirror;
   wherein the first transistor has a first gate length different from a second gate length of the second transistor;
   wherein the first transistor comprises a series of a first number of third series-coupled MOS-type transistors, and a sum of the gate lengths of the third transistors is equal to the first gate length; and
   wherein the second transistor comprises a series of a second number of fourth series-coupled MOS-type transistors, and a sum of the gate lengths of the fourth transistors is equal to the second gate length.

2. The circuit according to claim 1, wherein the first gate length is a product of a first coefficient and of a reference gate length, the second gate length is a product of a second coefficient and of the reference gate length, and the first and second coefficients are rational numbers.

3. The circuit according to claim 1, wherein the third transistors all have a same fourth gate length, and the fourth transistors all have a same fifth gate length.

4. The circuit according to claim 1, wherein the third transistors and the fourth transistors all have a same gate length, and the first number is different from the second number.

5. The circuit according to claim 1, wherein the first number is greater than or equal to twenty, and the second number is greater than or equal to twenty.

6. The circuit according to claim 1, wherein gates of the third transistors and gates of the fourth transistors are all coupled to an interconnection node of gates of the first and second transistor.

7. The circuit according to claim 6, wherein among the fourth transistors, at least one is selectable and de-selectable.

8. The circuit according to claim 7, wherein the fourth selectable and de-selectable transistor is associated with a switch and with a fifth transistor.

9. The circuit according to claim 8,
wherein the switch is arranged between the gate of the associated fourth selectable and de-selectable transistor and the interconnection node, and/or
wherein the fifth transistor is arranged in parallel with the associated fourth selectable and de-selectable transistor.

10. The circuit according to claim 7, wherein the fourth selectable and de-selectable transistor is associated with a selector.

11. The circuit according to claim 6,
wherein the fourth selectable and de-selectable transistor is associated with a selector; and
wherein the selector is arranged between the gate of the associated fourth selectable and de-selectable transistor and the interconnection node.

12. The circuit according to claim 1, wherein among the third transistors, at least one is selectable and de-selectable.

13. The circuit according to claim 1, wherein the first transistor has a first gate width different from a second gate width of the second transistor.

14. An integrated circuit comprising:
a current mirror comprising:
a first metal oxide semiconductor (MOS)-type transistor having a first gate length; and
a second MOS-type transistor having a second gate length;
wherein the first gate length is different from the second gate length;
wherein the first transistor comprises a series of a first number of third series-coupled MOS-type transistors, and a sum of the gate lengths of the third transistors is equal to the first gate length; and
wherein the second transistor comprises a series of a second number of fourth series-coupled MOS-type transistors, and a sum of the gate lengths of the fourth transistors is equal to the second gate length.

15. The integrated circuit according to claim 14, wherein the first gate length is a product of a first coefficient and of a reference gate length, the second gate length is a product of a second coefficient and of the reference gate length, and the first and second coefficients are rational numbers.

16. The integrated circuit according to claim 14, wherein the first transistor has a first gate width different from a second gate width of the second transistor.

17. The circuit according to claim 14, wherein the third transistors all have a same fourth gate length, and the fourth transistors all have a same fifth gate length.

18. The circuit according to claim 14, wherein gates of the third transistors and gates of the fourth transistors are all coupled to an interconnection node of gates of the first and second transistor.

19. The circuit according to claim 14, wherein among the third transistors, at least one is selectable and de-selectable.

20. A current mirror circuit comprising:
a first metal oxide semiconductor (MOS)-type transistor and a second MOS-type transistor assembled as a current mirror;
wherein the first transistor has a first gate length different from a second gate length of the second transistor; and
wherein the first gate length is a product of a first coefficient and of a reference gate length, the second gate length is a product of a second coefficient and of the reference gate length, and the first and second coefficients are rational numbers.

* * * * *